US007671697B2

(12) United States Patent
Mun et al.

(10) Patent No.: US 7,671,697 B2
(45) Date of Patent: Mar. 2, 2010

(54) HIGH-ISOLATION SWITCHING DEVICE FOR MILLIMETER-WAVE BAND CONTROL CIRCUIT

(75) Inventors: Jae Kyoung Mun, Daejeon (KR); Hae Cheon Kim, Daejeon (KR); Dong Young Kim, Daejeon (KR); Jong Won Lim, Daejeon (KR); Ho Kyun Ahn, Daejeon (KR); Hyun Kyu Yu, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 163 days.

(21) Appl. No.: 11/928,410

(22) Filed: Oct. 30, 2007

(65) Prior Publication Data

US 2008/0129427 A1 Jun. 5, 2008

(30) Foreign Application Priority Data

Dec. 5, 2006 (KR) ...................... 10-2006-0122507
Jun. 15, 2007 (KR) ...................... 10-2007-0058778

(51) Int. Cl.
*H01P 1/10* (2006.01)
*H01L 29/80* (2006.01)

(52) U.S. Cl. ....................................... 333/101; 333/103

(58) Field of Classification Search ................. 333/262, 333/101, 103, 104
See application file for complete search history.

(56) References Cited

U.S. PATENT DOCUMENTS

| | | | | |
|---|---|---|---|---|
| 5,872,369 A | 2/1999 | Inokuchi et al. | | |
| 5,883,407 A * | 3/1999 | Kunii et al. | ................. | 257/275 |
| 6,020,613 A * | 2/2000 | Udomoto et al. | ............ | 257/341 |
| 6,320,476 B1 * | 11/2001 | Tsukahara | .................. | 333/104 |
| 6,534,725 B2 * | 3/2003 | Tsukahara | .................. | 174/260 |

FOREIGN PATENT DOCUMENTS

| | | |
|---|---|---|
| JP | 06-334525 | 12/1994 |
| JP | 11-17063 | 1/1999 |
| JP | 2002-043811 | 2/2002 |

(Continued)

OTHER PUBLICATIONS

"A high-performance 40-85 GHz MMIC SPDT switch using FET-integrated transmission line structure", Junghyun Kim et al., Microwave and Wireless Components Letters, IEEE, vol. 13, Issue 12, Dec. 2003 pp. 505-507.

*Primary Examiner*—Dean O Takaoka
(74) *Attorney, Agent, or Firm*—Rabin and Berdo, P.C.

(57) ABSTRACT

Provided is a high-isolation switching device for a millimeter-wave band control circuit. By optimizing a cell structure to improve the isolation of an off-state without deteriorating the insertion loss of an on-state, it is possible to implement a high-isolation switching device useful in the design and manufacture of a millimeter-wave band control circuit such as a phase shifter or digital attenuator using switching characteristics. In addition, when a switch microwave monolithic integrated circuit (MMIC) is designed to use the switching device, it is not necessary to use a multi-stage shunt field effect transistor (FET) to improve isolation, nor to dispose an additional λ/4 transformer transmission line, inductor or capacitor near the switching device. Thus, chip size can be reduced, degree of integration can be enhanced, and manufacturing yield can be increased. Consequently, it is possible to reduce manufacturing cost.

6 Claims, 2 Drawing Sheets

FOREIGN PATENT DOCUMENTS

| | | |
|---|---|---|
| JP | 2002-252302 | 9/2002 |
| JP | 2002-290115 | 10/2002 |
| JP | 2002-353411 | 12/2002 |
| JP | 2003-289083 | 10/2003 |
| KR | 1020030056332 | 7/2003 |
| KR | 1020050054602 | 6/2005 |

* cited by examiner

HIGH-ISOLATION SWITCHING DEVICE FOR MILLIMETER-WAVE BAND CONTROL CIRCUIT

CROSS-REFERENCE TO RELATED APPLICATION

This application claims priority to and the benefit of Korean Patent Application No. 2006-122507, filed Dec. 5, 2006, and No. 2007-58778, filed Jun. 15, 2007, the disclosure of which is incorporated herein by reference in its entirety.

BACKGROUND

1. Field of the Invention

The present invention relates to a high-isolation switching device for a millimeter-wave band control circuit, and more particularly, to a compound semiconductor switching device that is the core device of a switch microwave monolithic integrated circuit (MMIC) used to control transmission and reception of a high-frequency signal in a millimeter-wave band communication system, has high isolation and low insertion loss, and is appropriate for designing and manufacturing a small radio frequency (RF) control circuit chip.

The present invention has been produced from the work supported by the IT R&D program of MIC (Ministry of Information and Communication)/IITA (Institute for Information Technology Advancement) [2006-S-077-01, Components/System for Millimeter-wave Passive Image Sensor] in Korea.

2. Discussion of Related Art

In a high-frequency communication system such as a wireless local area network (LAN), a radar system for car collision avoidance, etc., millimeter-waves in a several tens of GHz band are generally used. And, a switching device for switching such a high-frequency signal is often used in a switching circuit of an antenna, a transmission/reception switching circuit, and so on.

A field effect transistor (FET) such as a high electron mobility transistor (HEMT), a metal-semiconductor field effect transistor (MESFET), etc., is generally used as the switching device. Here, the HEMT is a compound semiconductor transistor that has a fine transmission characteristic and a drive voltage characteristic in a millimeter-wave band, low current consumption, includes a simple bias circuit, and facilitates implementation of multiple ports and integration.

Such a switch circuit needs a technique to minimize insertion loss and reduce isolation deterioration caused by parasitic components such as inductance, capacitance, etc. In particular, for a small RF control circuit, design of a high-isolation switching device is very important.

A single-pole-double-throw (SPDT) switch circuit mainly used for changing transmitting and receiving paths of a signal uses only a shunt structure. This is because it is difficult to obtain an isolation equal to or less than −30 dB between the transmitting path and the receiving path in a series-shunt structure, which has too much insertion loss and does not ensure isolation in a millimeter-wave band of a several tens of GHz.

The shunt structure connects a ground via hole to a drain or source of a switching device, and adjusts the voltage of a gate, which is a control electrode, according to a millimeter-wave signal input to the source or drain electrode, thereby making an unwanted signal flow to ground and finally intercepting the flow to an output end.

Conventionally, a multi-stage shunt technique is generally used to ensure high isolation in such a shunt structure. However, when the multi-stage shunt technique is used, a chip size increases due to a λ/4 transformer transmission line, a plurality of FETs, and an inductor or capacitor added around a switching device, thereby increasing manufacturing cost.

To solve this problem, a "Millimeter-Band Semiconductor Switching Circuit" that improves isolation by minimizing a distance between a via hole and a transmission line is disclosed in U.S. Pat. No. 6,320,476 (filed on Nov. 20, 2001).

However, the switching circuit has a structure in which a transmission line and via holes are perpendicularly connected for minimizing the distance between them. Since only 2 via holes can be disposed, there is a limit to the degree of isolation per unit cell, and insertion loss increases in proportion to the impedance of the transmission line. In addition, like the conventional multi-stage shunt technique, chip manufacturing cost increases.

SUMMARY OF THE INVENTION

The present invention is directed to a high-isolation switching device that has a cell structure optimized to improve isolation of an off-state without deteriorating insertion loss of an on-state and thus is useful in the design and manufacture of a millimeter-wave band control circuit, such as a phase shifter or digital attenuator using switching characteristics.

The present invention is also directed to reducing the size of a switching device and manufacturing cost by improving isolation without using another device.

One aspect of the present invention provides a high-isolation switching device for a millimeter-wave band control circuit, the device comprising: a unit cell in which a transistor is perpendicularly connected to an input/output transmission line. And, the unit cell includes a plurality of ground via holes symmetrically formed in upper and lower portions of the input/output transmission line.

BRIEF DESCRIPTION OF THE DRAWINGS

The above and other objects, features and advantages of the present invention will become more apparent to those of ordinary skill in the art by describing in detail preferred embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to fully enable those of ordinary skill in the art to embody and practice the present invention.

Figure 1:
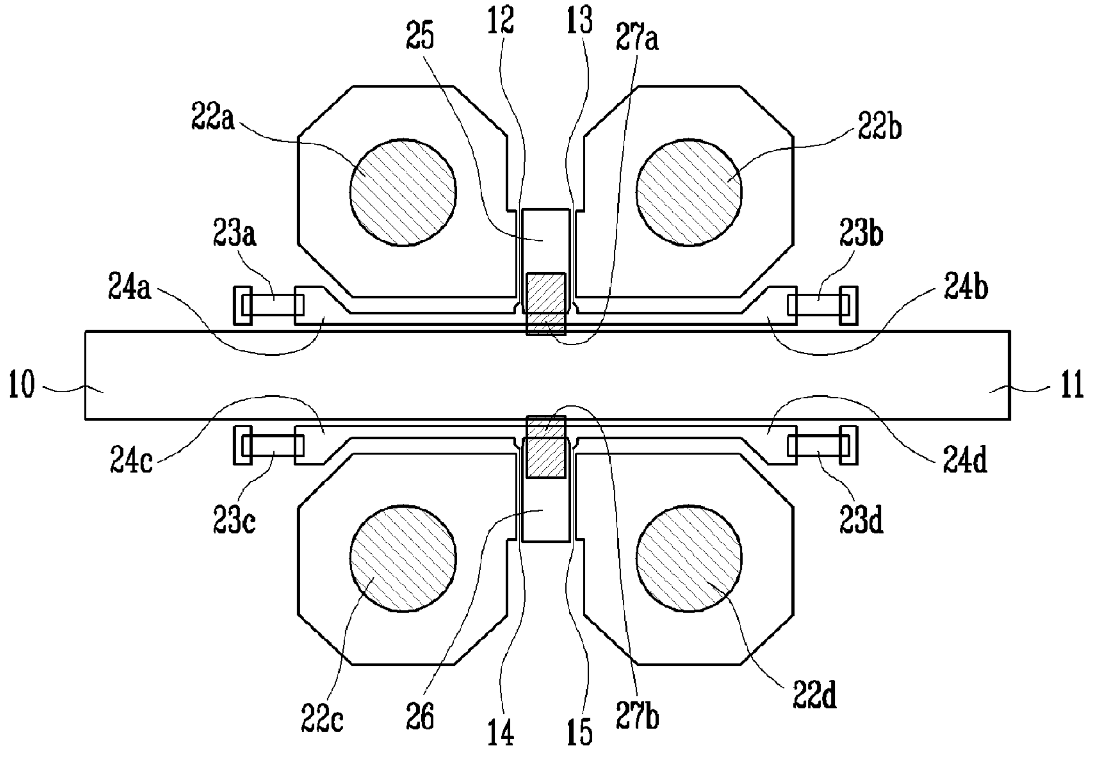
FIG. 1 illustrates a cell structure of a high-isolation switching device for a millimeter-wave band control circuit according to a first exemplary embodiment of the present invention.

FIG. 1 illustrates a cell structure of a high-isolation switching device 100 for a millimeter-wave band control circuit according to a first exemplary embodiment of the present invention.

As illustrated in FIG. 1, the switching device 100 according to the first exemplary embodiment of the present invention comprises: an input transmission line 10; an output transmission line 11; a transistor having gate electrodes 12, 13, 14 and 15, drain electrodes 25 and 26, and source electrodes (not shown in the drawing); metal gate connectors 24*a*, 24*b*, 24*c* and 24*d*; air bridge metals 27*a* and 27*b*; first, second, third and fourth ground via holes 22*a*, 22*b*, 22*c* and 22*d*; and mesa resistors 23*a*, 23*b*, 23*c* and 23*d*.

The input transmission line 10 and the output transmission line 11 may have a low impedance to reduce the insertion loss of an on-state, and the transistor may be a field effect transistor (FET).

The gate electrodes 12 to 15 are connected with each other through the gate connection metals 24*a* to 24*d*, and the drain electrodes 25 and 26 are connected to the input transmission line 10 and the output transmission line 11 through the air bridge metals 27*a* and 27*b*. Here, it is possible to ground an unwanted signal by connecting the source electrode of the transistor (not shown in the drawing) or the drain electrodes 25 and 26 to one of the first to fourth ground via holes 22*a* to 22*d*.

The first to fourth ground via holes 22*a* to 22*d* are connected to the source electrode (not shown in the drawing), and the mesa resistors 23*a* to 23*d* are disposed at front ends of the gate connection metals 24*a* to 24*d* and have a high resistance of several kΩ for isolation between power supply and a radio frequency (RF). Here, the shorter the distance between the first to fourth ground via holes 22*a* to 22*d* and the transmission lines 10 and 11, the better an isolation characteristic becomes. In this exemplary embodiment, the distance is a process margin of about 10 μm.

The switching device 100 according to the first exemplary embodiment of the present invention constituted as described above can increase the isolation of an off-state by the first to fourth ground via holes 22*a* to 22*d* without deteriorating the insertion loss of the on-state, and also enables chip size to be reduced. This will now be described in further detail.

First, as illustrated in FIG. 1, the switching device 100 according to the first exemplary embodiment of the present invention has a unit cell structure in which ground via holes can be symmetrically formed in upper and lower portions of the transmission lines 10 and 11. In this exemplary embodiment, the four ground via holes 22*a* to 22*d* are disposed in the unit cell.

Here, the isolation characteristic of the off-state and the insertion loss characteristic of the on-state vary according to the number of ground via holes, which will be described below in further detail with reference to FIG. 2.

Figure 2:
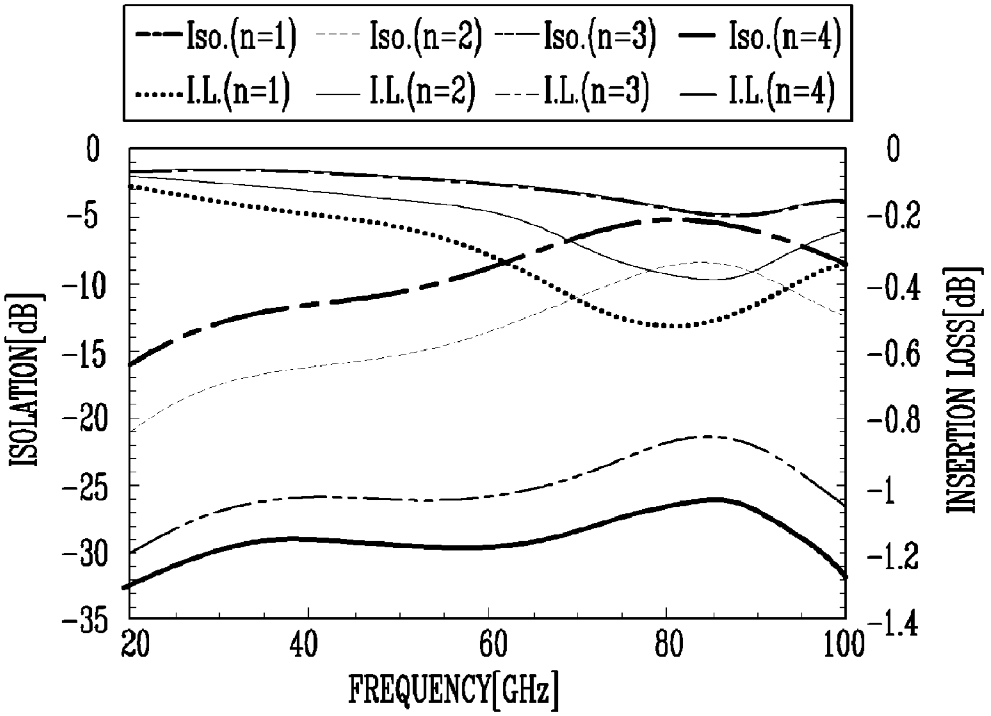
FIG. 2 is a graph showing isolation of an off-state and insertion loss of an on-state according to the number of ground via holes calculated by a commercial simulator.

FIG. 2 is a graph showing isolation of the off-state and insertion loss of the on-state according to the number of ground via holes calculated by a commercial simulator.

As illustrated in FIG. 2, in a shunt structure in which an input signal flows to a ground via hole, with increase in a number n of ground via holes connected to the transmission lines and the transistor, the insertion loss of the on-state does not deteriorate, and the isolation characteristic of the off-state is improved. This is because increase in the number n of ground via holes leads to reduction in an effective inductance component and thereby reduces the on-state impedance of the transistor.

In other words, the switching device 100 of the present invention has the unit cell structure in which ground via holes can be symmetrically disposed as illustrated in FIG. 1, and thus it is very easy to increase the number of ground via holes. Consequently, as illustrated in FIG. 2, it is possible to obtain excellent isolation equal to or greater than −29 dB without deteriorating the insertion loss of the on-state in a millimeter-wave band between 60 GHz and 94 GHz.

In addition, the switching device 100 of the present invention has a simple circuit layout due to the above-described symmetric unit cell structure and thus enables the chip size of an integrated circuit to be reduced. Therefore, it is possible to reduce manufacturing cost by improving the yield of a manufacturing process and the degree of integration.

Meanwhile, when a millimeter-wave signal input to the input transmission line 10 leaks, the isolation characteristic of the circuit may deteriorate. To solve this problem, the present invention prevents a millimeter-wave signal from leaking 3 times by ground via holes and thereby further improves the isolation characteristic of the off-state. This will be described below in further detail.

Figure 3A:
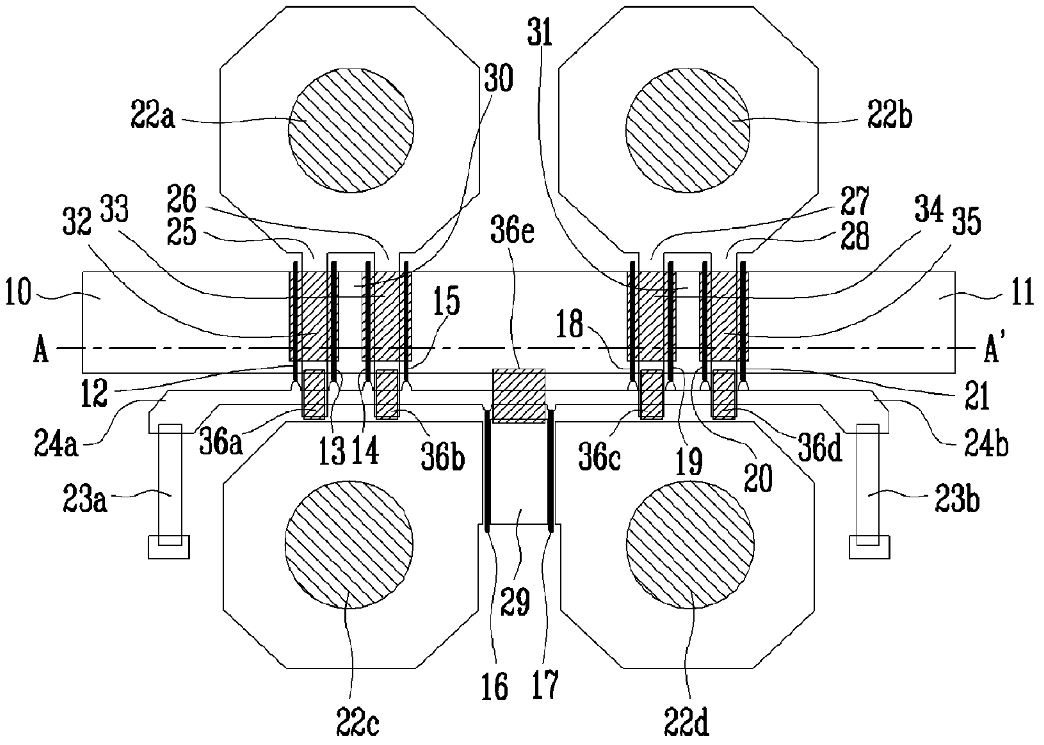
FIG. 3A illustrates a cell structure of a high-isolation switching device for a millimeter-wave band control circuit according to a second exemplary embodiment of the present invention.
Figure 3B:
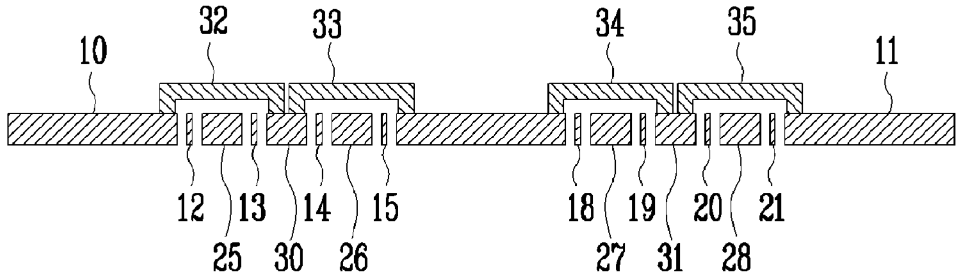
FIG. 3B is a cross-sectional view of the switching device of FIG. 3A.

FIG. 3A illustrates a cell structure of a high-isolation switching device 300 for a millimeter-wave band control circuit according to a second exemplary embodiment of the present invention, and FIG. 3B is a cross-sectional view of the switching device 300 of FIG. 3A.

Referring to FIGS. 3A and 3B, the switching device 300 according to the second exemplary embodiment of the present invention comprises: an input transmission line 10; an output transmission line 11; a transistor having gate electrodes 12, 13, 14, 15, 16, 17, 18, 19, 20 and 21, drain electrodes 25, 26, 27, 28 and 29, and source electrodes 30 and 31; gate connection metals 24*a* and 24*b*; air bridge metals for drain electrodes 36*a*, 36*b*; 36*c*, 36*d* and 36*e*; air bridge metals for source electrodes 32, 33; 34 and 35; first, second, third and fourth ground via holes 22*a*, 22*b*, 22*c* and 22*d*; and mesa resistors 23*a*, 23*b*

The switching device 300 according to the second exemplary embodiment of the present invention constituted as described above can increase the isolation of the off-state by the first to fourth ground via holes 22*a* to 22*d* without deteriorating the insertion loss of the on-state, and also can further improve an isolation characteristic by preventing a millimeter-wave signal input to the input transmission line 10 from leaking.

Preventing millimeter-wave signal leakage will now be described in further detail. A millimeter-wave signal input to the input transmission line 10 is transferred to the first and third ground via holes 22*a* and 22*c* through the drain electrodes 25 and 26 and the air bridges for drain electrodes 36*a* and 36*b* and is first blocked by the first and third ground via holes 22*a* and 22*c*. The millimeter-wave signal leaking from the first and third ground via holes 22*a* and 22*c* is transferred to the third and fourth ground via holes 22*c* and 22*d* through the air bridge for a drain electrode 36*e* and is secondarily blocked by the third and fourth ground via holes 22*c* and 22*d*. The millimeter-wave signal leaking from the third and fourth ground via holes 22*c* and 22*d* is transferred to the second and fourth ground via holes 22*b* and 22*d* through the drain electrodes 27 and 28 and the air bridges for drain electrodes 36*c* and 36*d* and is thirdly blocked by the second and fourth ground via holes 22*b* and 22*d*.

In other words, it is possible to increase the isolation of the off-state without deteriorating the insertion loss of the on-state by the first to fourth ground via holes 22*a* to 22*d*. In addition, by preventing a millimeter-wave signal from leaking 3 times, it is possible to further improve the isolation characteristic of the off-state. Thus, isolation obtained by a conventional transistor structure having 3 stages or more can be obtained by a 2- or single-stage transistor structure, and a multi-stage shunt structure is not needed for improving isolation. Consequently, it is possible to reduce the size of the switching device and manufacturing cost.

As described above, according to the switching device of the present invention, it is possible to improve the isolation of the off-state without deteriorating the insertion loss of the on-state by a plurality of ground via holes. Thus, it is possible to implement a high-isolation switching device useful in the design and manufacture of a millimeter-wave band control circuit such as a phase shifter or digital attenuator using switching characteristics.

In addition, when a switch microwave monolithic integrated circuit (MMIC) is designed to use a switching device of the present invention, it is not necessary to use a multi-stage shunt FET to improve isolation nor to dispose an additional λ/4 transformer transmission line, inductor or capacitor near the switching device. Thus, chip size can be reduced, the degree of integration can be enhanced, and manufacturing yield of a switch circuit can be increased. Consequently, it is possible to reduce manufacturing cost.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A high-isolation switching device for a millimeter-wave band control circuit, comprising:

a unit cell having a transistor and an input/output transmission line perpendicularly connected to each other, wherein the unit cell includes a plurality of ground via holes formed adjacent to the input/output transmission line, and wherein the ground via holes prevent an input signal from leaking multiple times, such that the input signal is transferred to one of the ground via holes and prevented from leaking a first time and then the input signal leaking from said one ground via hole is transferred to another ground via hole and prevented from leaking a second time.

2. The high-isolation switching device of claim 1, wherein as the number of ground via holes increases, the increase of an on-state impedance of the transistor with frequency is reduced without deteriorating the insertion loss of the on-state, and an isolation of an off-state of the switch increases.

3. The high-isolation switching device of claim 1, wherein a source electrode or a drain electrode of the transistor is connected to the ground via holes and grounded.

4. The high-isolation switching device of claim 1, wherein the transistor is a compound semiconductor transistor or a field effect transistor (FET).

5. The high-isolation switching device of claim 1, wherein when first to fourth ground via holes are disposed in the unit cell, the input signal is transferred to the first and third ground via holes and prevented from leaking a first time, the input signal leaking from the first and third ground via holes is transferred to the third and fourth ground via holes and prevented from leaking a second time, and the input signal leaking from the third and fourth ground via holes is transferred to the second and fourth ground via holes and prevented from leaking a third time.

6. The high-isolation switching device of claim 1, wherein the unit cell further comprises:

a gate connection metal for connecting a gate electrode of the transistor;

a air bridge metal for a drain electrode for connecting a drain electrode of the transistor to the input/output transmission line;

a air bridge metal for a source electrode for connecting a source electrode of the transistor to the input/output transmission line; and a mesa resistor disposed at a front end of the gate connection metal.

* * * * *